United States Patent [19]
Amsden et al.

[11] Patent Number: 5,778,481
[45] Date of Patent: Jul. 14, 1998

[54] SILICON WAFER CLEANING AND POLISHING PADS

[75] Inventors: Michael R. Amsden, Londonderry, Vt.; Richard A. Bartley, Newburgh, N.Y.; Cuc Huynh, Jehrico, Vt.; Paul A. Manfredi, Waterbury, Vt.; Douglas P. Nadeau, Underhill, Vt.

[73] Assignee: International Business Machines Corporation, Armonk, N.Y.

[21] Appl. No.: 690,284

[22] Filed: Jul. 26, 1996

Related U.S. Application Data

[62] Division of Ser. No. 601,670, Feb. 15, 1996, abandoned.

[51] Int. Cl.$^6$ .................................................. B08B 11/00
[52] U.S. Cl. .................. 15/230.16; 15/230; 15/97.1; 15/102
[58] Field of Search ........................ 15/3, 97.1, 98, 15/102, 230, 230.12, 230.14, 230.16, 230.18, 385, 97.2, 97.3; 451/548, 550, 446, 527, 530

[56] References Cited

U.S. PATENT DOCUMENTS

| | | |
|---|---|---|
| 4,566,911 | 1/1986 | Tomita et al. |
| 4,811,443 | 3/1989 | Nishizawa ............ 15/97.1 |
| 5,123,216 | 6/1992 | Kloss ................... 15/97.1 |
| 5,144,711 | 9/1992 | Gill, Jr. |
| 5,311,634 | 5/1994 | Andros |
| 5,320,706 | 6/1994 | Blackwell |
| 5,375,291 | 12/1994 | Tateyama et al. |
| 5,624,501 | 4/1997 | Gill, Jr. ............... 15/97.1 |

FOREIGN PATENT DOCUMENTS 1-254110  4/1988  Japan

*Primary Examiner*—Randall Chin
*Attorney, Agent, or Firm*—Schmeiser, Olsen & Watts; Howard J. Walter, Jr.

[57] ABSTRACT

Disc shaped cleaning/polishing pads are disclosed for use on a cleaning/polishing apparatus wherein the surface of the cleaning/polishing pad comprises resilient members arranged in patterns which will facilitate the movement of fluids (deoinized water, chemical slurry, etc.) from the center region of the pad to the periphery of the pad. Arrangement of the resilient members on the pads may be spiral, swirl, concentric or any other suitable pattern which will direct fluids to the periphery of the pad upon rotation of the pad.

6 Claims, 3 Drawing Sheets

SILICON WAFER CLEANING AND POLISHING PADS

This application is a divisional of application Ser. No. 08/601,670 filed on Feb. 15, 1996, now abandoned.

BACKGROUND OF INVENTION

1. Technical Field

This invention generally relates to brush cleaners' sponges and polishing pads, and more specifically relates to rotatable brush and polishing pad surfaces for use with silicon wafer cleaning devices.

2. Background Art

Many of today's industrial operations require the efficient and accurate ability to polish and clean highly finished surfaces. Semiconductor materials, such as silicon wafers, require the removal of particles and other surface contaminants during their manufacturing process. Other surfaces, such as optical glass or magnetic storage devices may also require a similar means for contaminant removal. Operations that involve semiconductor materials often utilize a two-step process that includes a polishing step and then a brushing step. One of the main goals of the polishing step is to "planarize" the wafer, while the main goal of the brushing step is to perform a final cleaning of the wafer.

In the manufacture of integrated circuits, Chemical Mechanical Polishing (CMP) has emerged as the premier "polishing" technique to achieve both local and global planarization. CMP techniques typically utilize a polishing pad (e.g., felt) along with a polishing slurry. Primary concerns of CMP use include the accurate, controlled delivery of the polishing slurry to attain wafer surface planarity and the efficient and complete removal of the slurry. The brushing step, or "post-CMP" operation, is typically performed with the use of a brush device that comprises a sponge-type cleaning pad along with the introduction of a fluid (e.g., water). Similar to the polishing step, post-CMP concerns include the accurate and efficient delivery and removal of the fluid and CMP contaminants.

One particular method for polishing and cleaning wafers utilizes rotating pads that contact and polish/clean the wafer as they spin. Examples of such systems include the WESTECH 3800™ cleaner which performs the brushing operation and the WESTECH 372™ polisher which performs the polishing operation. These types of systems utilize pads that include a plurality of raised resilient members (also referred to as "nubs" or "nipples") attached thereto to allow the rotation of the pad to brush away undesired particles. To further facilitate cleaning, these systems introduce a fluid or slurry onto the pad during the cleaning operations. Typical systems introduce the fluid/slurry near the center of the pad and then allow it to travel under centrifugal force outwardly between the nubs. U.S. Pat. No. 5,144,711 issued to Gil, Jr. entitled "Cleaning Brush for Semiconductor Wafer" on Sept. 8, 1992, discloses such a system.

Unfortunately, current wafer cleaning/polishing pads tend to exhibit non-uniformity during such operations due to the fact that slurry particles build up over time during the brushing and polishing cycles. Present art pads cause problems that include a reduced polishing rate and selectivity, scratching problems, contamination of slurry residues onto the polished wafer surfaces, and wafer breakage due to pad/wafer increased surface tension caused by wafer sticking.

The result is that the polishing pad has to be constantly conditioned or cleaned to rid off CMP slurry residue which became attached to the pad. 10 This cleaning step further increases the polishing cycle time and does not guarantee to alleviate the problem of slurry contaminants from reattaching to the polished wafer surface. In addition, wafers must be re-measured after the polishing operation.

Present art pads, such as those shown in U.S. Pat. No. 5,311,634 entitled "Sponge Cleaning Pad" issued to Andros on May 17, 1994, and U.S. Pat. No. 5,144,711 issued to Gil, Jr. teach of arranging the brush nipples in clusters or fields with open spaces to facilitate the outward laminar flow of fluids. Unfortunately, these pad designs fail to adequately disperse the fluid or slurry that builds up in between the pad and the wafer. The result is that current CMP/post-CMP techniques utilizing commercially available polishing pads cannot meet the integrated circuit (IC) manufacturer's expectation of a higher throughput. Because of these limitations, the wafer brushing and polishing cycles are very slow and expensive.

Therefore, there existed a need to provide an improved silicon wafer brush and polishing pad for eradicating the effluent created during a cleaning operation. The aforementioned prior art is herein incorporated by reference.

DISCLOSURE OF INVENTION

The present invention provides a rotatable brush/polishing pad with a brush/polishing surface that includes a plurality of raised ridged surfaces that define grooves. In a typical embodiment, the pad is essentially disc shaped and made from a resilient and/or sponge-like material such as polyvinyl alcohol (PVA), polyurethane, urethane, felt or dipped cloth. However, any suitable shape or material may be used. The grooves provide a means for channeling fluid on the pad surface to the periphery of the disc upon rotation of the disc. In particular, the grooves along with the rotating motion of the pad provides a radial centrifugal effect with a pump-like action to evacuate particles.

The grooves provide a means for collecting effluent during the cleaning and polishing processes and further provide a passageway for the peripheral discharging of the fluids during the rotation of the cleaning/polishing pad. The ridged surfaces that form the grooves may be arranged in any form that will better facilitate the removal of the fluid. For example, the passageways may be swirl shaped, spiral shaped, or circular shaped. The ridges may be continuous or noncontinuous. The ridged surfaces may be made from a compressible material to aid in the movement of fluids into the grooves.

While the cleaning/polishing pad and pad material is generally directed at cleaning/polishing silicon wafers, the system and pad material may be used for cleaning any highly finished surface such as optical devices and magnetic storage devices. In addition, the ridged surfaces may be contoured on the edge that contacts the highly finished surface (e.g., the silicon wafer surface) to increase pad life. In addition, the pad may be suitable for use with the WESTECH 3800 cleaner or 372 polishing system or any other system that features a rotatable pad.

In accordance with the above, it is an advantage of the present invention to provide a means for channeling effluent on the surface of a cleaning/polishing pad during rotation of the pad from the interior of the pad to the periphery of the pad.

In accordance with the above, it is a further advantage of the present invention to provide ridges that are arranged to act like pumps to aid in the removal of effluent.

In accordance with the above, it is a further advantage of the present invention to provide contoured ridged surfaces to greatly enhance brush life while lowering the foreign material (F.M.) residual, due to less brush deterioration.

In accordance with the above, it is a further advantage of the present invention to utilize the centrifugal force present during the rotation of the pad to force any unwanted residue or slurry to the periphery of the pad.

In accordance with the above, it is a further advantage of the present invention to provide an enhanced brush design that will result in lower defect density for post-CMP wafers, thereby, resulting in higher final wafer test yields.

In accordance with the above, it is a further advantage of the present invention to provide a system that will lengthen the brush lifetime and thereby lower CMP cost of ownership.

In accordance with the above, it is a further advantage of the present invention to reduce down time of wet chemical stations due to foreign material (F.M.) excursions.

In accordance with the above, it is a further advantage of the present invention to provide a brush design with ridged surfaces that can be utilized to free particles from the wafer surface using a mechanical scrubbing action and dispense of residues created thereby.

In accordance with the above, it is a further advantage of the present invention to provide pad designs that will work with both the brush operations and polishing operations.

The foregoing and other objects, features and advantages of the invention will be apparent from the following more particular description of (a) preferred embodiment(s) of the invention, as illustrated in the accompanying drawing(s).

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
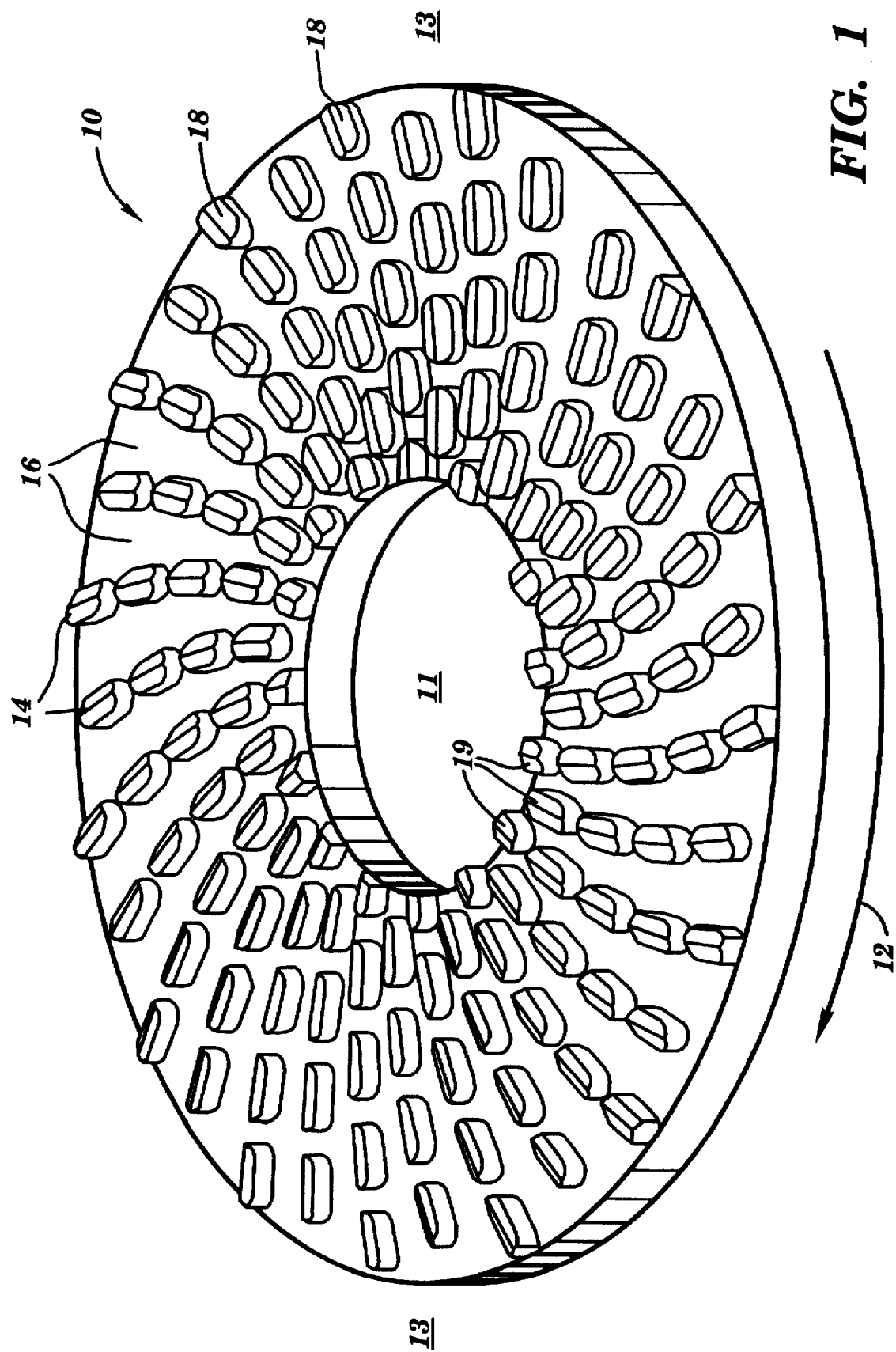
FIG. 1 discloses a first embodiment of a cleaning/polishing pad pursuant to a preferred embodiment of the present invention featuring raised ridges that form noncontinuous swirl patterns.

Referring now to the drawings, all references to pads, cleaning pads, polishing pads and brushes are assumed to be essentially equivalent and/or interchangeable for the purposes of this disclosure.

FIG. 1 depicts a first embodiment of a pad 10. The pad 10 is essentially disc shaped and is suitable for mounting on a rotatable apparatus (not shown). The pad 10 is a resilient disc having a center region 11 and a peripheral region 13. During operation, the disc will rotate in the direction of arrow 12. Pad 10 comprises a plurality of noncontinuous raised ridged surfaces 14. Pursuant to this embodiment, the raised ridged surfaces 14 are shown arranged in a "swirl" pattern comprising a plurality of spokes 19 that extend from the center region 11 to the peripheral region 13. The raised ridged surfaces 14 form grooves 16 that provide a plurality of unimpeded passageways running from the center 11 to the periphery 13 of the pad 10. When the pad 10 spins in the direction of arrow 12, fluids that are present on the pad get forced via the grooves to the periphery of the pad where the fluid can then be discharged. Prior devices which provide randomnly spaced nubs fail to provide this functionality.

In addition, the raised ridged surfaces 14 may be shaped to include a "contoured" edged portion 18. The edge portion 18 may be slanted, curved, rounded or formed in any shape such that the raised ridged surface 14 more evenly contacts the wafer surface during rotation of the pad in the direction of arrow 12.

Figure 2A:
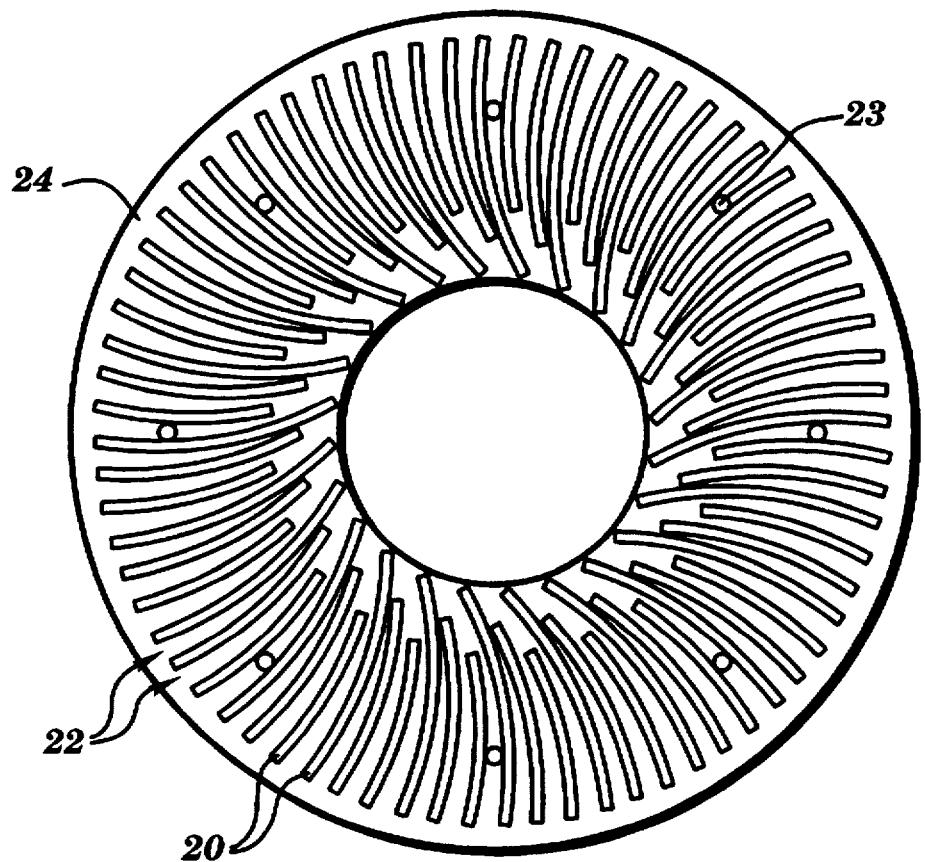
FIG. 2A discloses a second embodiment of a cleaning/polishing pad pursuant to the present invention featuring raised ridges that form continuous swirl patterns.
Figure 2B:
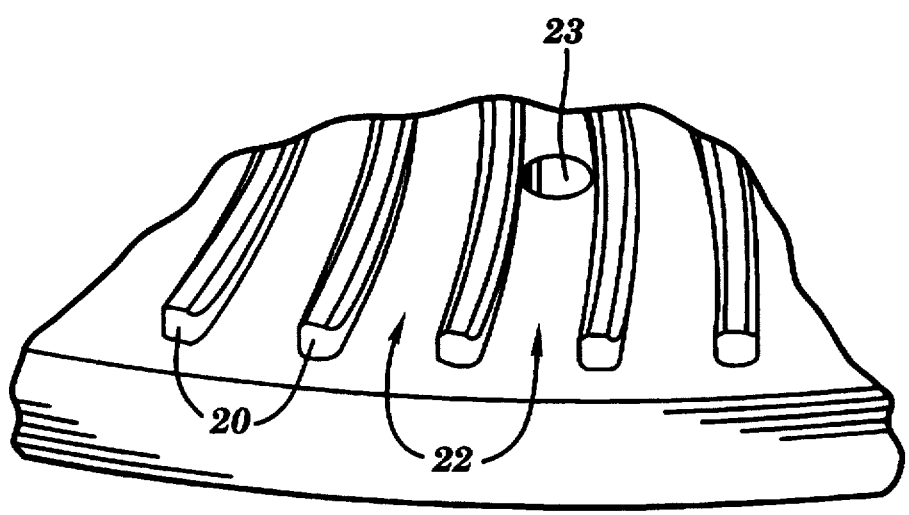
FIG. 2B depicts a blown-up view of the second embodiment of the cleaning/polishing pad pursuant to the present invention featuring raised ridges that form continuous swirl patterns.

FIG. 2A depicts a second embodiment of a pad surface 24. This embodiment is similar to that shown in FIG. 1 in that the pad surface 24 includes "swirl shaped" raised ridged surfaces 20 to form grooves 22. However, in this embodiment, the raised ridged surfaces 20 are continuous. That is, the raised ridged surfaces 20 extend from near the center of the pad to the periphery of the pad. Similar to that shown in FIG. 1, and as shown in FIG. 2B, the raised ridged surfaces 20 may also be "contoured" to evenly meet the wafer surface during rotation of the pad 24. In addition, FIGS. 2A and 2B show holes 23 which can be used to deliver fluids to the pad surface. It is recognized that this or any other known means for applying the fluid to the pad and wafer may be used on any embodiment of this invention.

Figure 3:
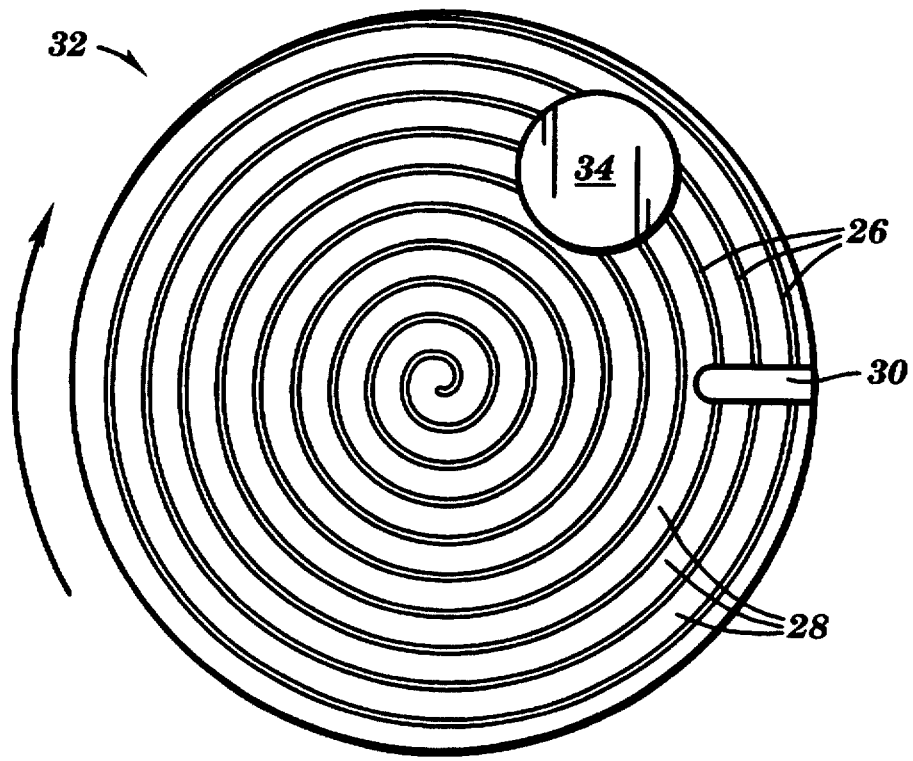
FIG. 3 discloses a third embodiment of a cleaning/polishing pad pursuant to the present invention featuring raised ridges that form a spiral pattern.

FIG. 3 depicts a third embodiment of the present invention. Pad 32 features raised ridged surfaces 26 arranged in a "spiral" or "nautilus" pattern to form grooves 28. This arrangement may also include a channel 30 extending substantially perpendicular to the direction of the grooves 28 to further facilitate the movement of the slurry to the periphery of the pad 32. To further illustrate the operation of a typical polishing system, FIG. 3 also shows wafer 34 placed on the surface of the polishing pad in a typical polishing position.

Figure 4:
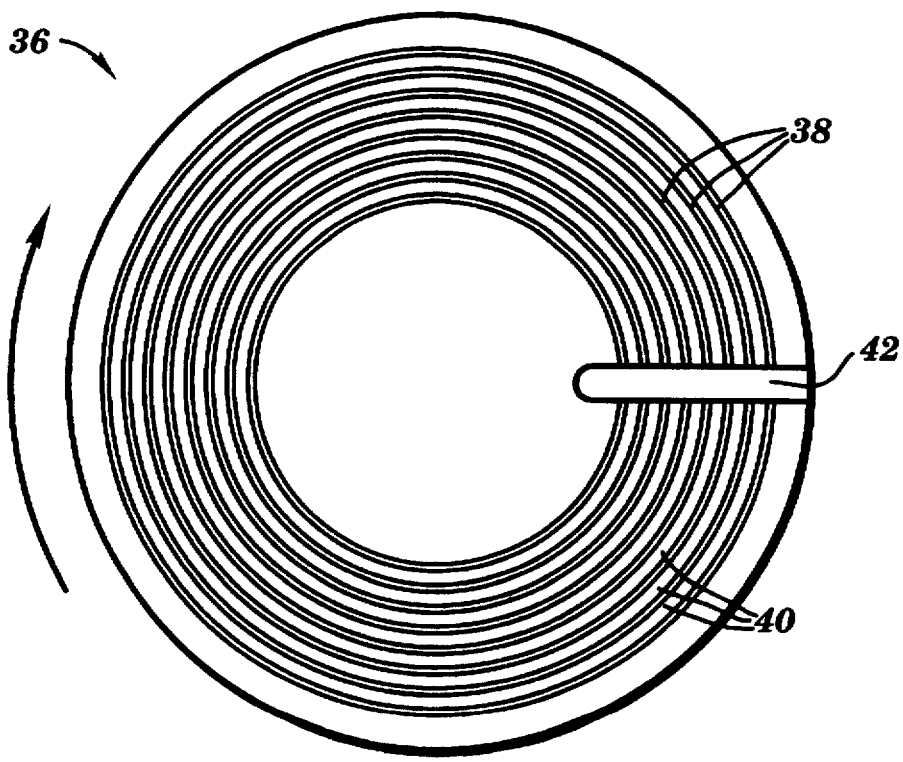
FIG. 4 discloses a fourth embodiment of a cleaning/polishing pad pursuant to the present invention featuring raised ridges in a concentric circle pattern with a radial channel.

FIG. 4 depicts a fourth embodiment of the present invention. This pad 36 features raised ridged surfaces 38 arranged in concentric circles to form grooves 40. The concentric circles may be "incomplete" in that a radial channel 42 is also included and extends from the center of the pad to the periphery to facilitate the movement of slurry to the periphery.

The foregoing descriptions of the preferred embodiments of the invention have been presented for purposes of illustration and description. It is not intended to be exhaustive or to limit the invention to the precise form disclosed, and obviously many modifications and variations are possible in light of the above teachings. Such modifications and variations that may be apparent to a person skilled in the art are intended to be included within the scope of this invention as defined by the accompanying claims.

We claim:

1. A rotatable pad with a surface having a plurality of spoke-like ridges that extend in an essentially radial direction from a center region of said pad to a peripheral region of said pad, wherein said plurality of spoke-like ridges are curved to form a swirl pattern, and wherein each of said spoke-like ridges is comprised of a plurality of non-continuous raised ridged surfaces.

2. The rotatable pad of claim 1 wherein said plurality of raised ridged surfaces are comprised of a sponge-like material.

3. The rotatable pad of claim 1 wherein said pad is made from materials comprising polyvinyl alcohol.

4. The rotatable pad of claim 1 wherein said pad is made from materials comprising polyurethane.

5. The rotatable pad of claim 1 wherein each raised ridged surface is contoured such that a portion of said raised ridged surface is angled with respect to the surface of said rotatable pad.

6. A rotatable pad with a surface having a plurality of raised regions for cleaning a highly finished surface, each of said raised regions having a cleaning surface that is angled with respect to said pad surface, and wherein said plurality of raised regions form a swirl pattern.

* * * * *